United States Patent [19]

Lory et al.

[11] Patent Number: 4,675,089

[45] Date of Patent: Jun. 23, 1987

[54] LOW TEMPERATURE DEPOSITION METHOD FOR HIGH QUALITY ALUMINUM OXIDE FILMS

[75] Inventors: Earl R. Lory; Leonard J. Olmer, both of Hopewell Township, Mercer County, N.J.

[73] Assignee: AT&T Technologies, Inc., Berkeley Heights, N.J.

[21] Appl. No.: 801,276

[22] Filed: Nov. 25, 1985

[51] Int. Cl.$^4$ .............................................. B05D 3/06
[52] U.S. Cl. ...................................... 204/164; 427/39
[58] Field of Search ........................... 204/164; 427/39

[56] References Cited

FOREIGN PATENT DOCUMENTS 48-31027  9/1973  Japan ................................... 204/164
0062161   5/1980  Japan ................................... 204/164

OTHER PUBLICATIONS

Preparation and Properties of Aluminum Oxide Films Obtained by Glow Discharge Technique, H. Katto et al., J. Electrochem. Soc., 118, (10), 1619–1623 (1971).

Electrical Properties of $Al_2O_3$ and $AlP_xO_y$ Dielectric Layers on InP, L. G. Meiners, Thin Solid Films, 113, 85–92 (1984).

Plasma Enhanced Metal–Organic Chemical Vapor Deposition of Aluminum Oxide Dielectric Film for Device Applications, K. P. Pande et al., J. Appl. Phys., 54, (9), 5436–5440, (1983).

*Primary Examiner*—John F. Niebling
*Assistant Examiner*—Nam X. Nguyen
*Attorney, Agent, or Firm*—J. F. Spivak

[57] ABSTRACT

A high quality $Al_2O_3$ film is deposited by means of plasma enhanced chemical vapor deposition by passing a trialkylaluminum vapor over the surface of a substrate and $CO_2$ gas as the oxidant in a plasma above the substrate surface. The $CO_2$ is controlled to prevent particle formation due to gas phase reaction in the plasma as opposed to directly on the substrate surface.

11 Claims, 6 Drawing Figures

LOW TEMPERATURE DEPOSITION METHOD FOR HIGH QUALITY ALUMINUM OXIDE FILMS

TECHNICAL FIELD

This invention relates to a method for depositing high quality aluminum oxide films at relatively low temperatures. More particularly, it deals with a plasma enhanced CVD deposition of such films which are useful, for example, in applications such as integrated circuits and optoelectronic devices.

BACKGROUND OF THE INVENTION

Integrated circuits and optoelectronic devices are becoming increasingly complex. This complexity is generally accompanied by a reduction in device dimensions and increased packing density. High processing temperatures, which were once tolerable in larger devices, are becoming unacceptable. Advances in deposition technology for depositing the various layers which may be used in such devices at decreased processing temperatures while maintaining film quality are required.

Generally, one reaches a point when reducing the temperature of a substrate during deposition of a film that will result in reduced quality of the deposited film unless nonthermal energy is added to the reacting system. Oxides such as aluminum oxide and silicon oxide as well as tantalum oxide have been the subject of study for many years and a variety of deposition techniques have been reported, including, chemical vapor deposition (CVD), plasma enhanced CVD, reactive sputtering, evaporation, RF sputtering, photochemical deposition and plasma deposition. Thermal CVD films have been produced using a variety of chemistries including the reaction of an oxidant, e.g., oxygen or nitrous oxide, with a metallo-organic compound or a metallo-chloride as the metal source. For example, in the case of aluminum oxide deposition, oxygen or nitrous oxide has been used in combination with trimethylaluminum or aluminum trichloride. Also, thermal decomposition of metal alkoxides such as aluminum tri-isopropoxide has also been employed. We have now discovered a modified plasma enhanced deposition technique which allows for the deposition of aluminum oxide films of high quality, at temperatures lower than heretofore achieved. This is particularly important in semiconductor applications, wherein the semiconductor device already possesses an aluminum film thereon or a film of another relative low melting material, where it is necessary that any subsequent film to be deposited or grown thereover be deposited or grown at temperatures less than the temperature that would cause melting or any other detrimental effect to the previously deposited film.

SUMMARY OF THE INVENTION

A method of plasma depositing a high quality, amorphous thin film of aluminum oxide comprising the steps of:

(1) applying an RF field across spaced electrodes in a partially evacuated vessel in a manner as to create a gas plasma between said electrodes, one of such electrodes itself being or supporting a substrate for film deposition;

(2) heating the substrate to a desired predetermined temperature;

(3) introducing a vapor of a trialkylaluminum reactant in an inert carrier gas into the vessel in a region at or near the substrate surface in a manner such that said vapor flows uniformly across said substrate surface; and (4) introducing $CO_2$ together with an inert carrier gas into the vessel in a region of the plasma above the region where said trialkyaluminum is introduced, said $CO_2$ being introduced at a concentration and rate such that the residence time of oxygen atoms produced by dissociation of the $CO_2$ in the plasma is insufficient to cause substantial particle formation due to gas phase reaction in the plasma and whereby a high quality amorphous aluminum oxide film is caused to grow on the substrate.

DETAILED DESCRIPTION

Figure 1:
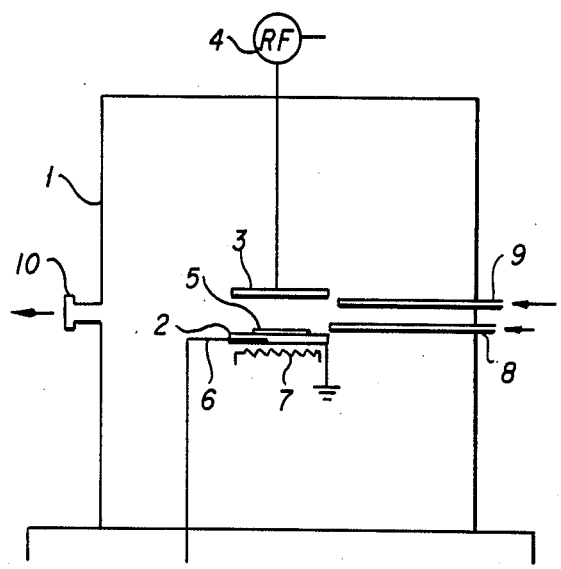
FIG. 1 is a schematic diagram of an apparatus useful in making aluminum oxide films in accordance with the present method.

The novel method for depositing aluminum oxide films may be practiced in a vacuum system of the type described in FIG. 1. Typically, a system which is capable of a base pressure of $10^{-6}$ torr is more than adequate since the base pressure to which the system is evacuated before each deposition run is generally in the range of 10 milli-torr. The pressure in the reactor vessel during each run is typically in the order of 0.5 torr. Referring to FIG. 1 one can see a schematic representation of the vacuum system. In accordance with the FIG. there is shown a housing 1. Within the housing 1 there is mounted a pair of spaced electrodes 2 and 3, one above the other. Typcially, these electrodes 2 and 3 are spaced about one inch apart. The electrode 3 is coupled to an RF generator 4 for creating a plasma therebetween during operation of the system. The bottom electrode 2 is typically grounded and supports a substrate 5 to be coated, such as a silicon wafer. Further, the bottom electrode 2 is provided with a thermocouple 6 for monitoring the temperature of the bottom electrode and substrate thereon. A heating element 7, such as a simple nichrome heater is provided under the bottom electrode 2 so as to heat the electrode 2 and substrate 5 to a predetermined desired temperature. A lower and an upper reaction gas inlet, 8 and 9, respectively, are provided adjacent the surface of the bottom and top electrodes 2 and 3, respectively, so as to cause the flow of the respective reactants over and across the area of the electrodes 2 and 3. The lower reactant gas inlet 8 provides a flow of a trialklyaluminum vapor mixed with an inert carrier gas over the surface of the substrate 5. The upper reactant gas inlet 9 provides a mixture of carbon dioxide with an inert carrier gas, such as argon, across the surface of the upper electrode 3. The unreacted gases are exhausted through a vacuum port 10 which is preferably situated in the same plane as the gap between the electrodes 2 and 3 to aid in the gas flow across the area between the electrodes 2 and 3.

In operation, the vacuum system is pumped down with a mechanical pump to the base pressure, e.g., 10 milli-torr. The pressure in the reactor is then raised to the reaction pressure, e.g., 0.5 torr, by the admission of the reaction mixture gas into the vessel with continued pumping. The pressure of the system is monitored so as to maintain the pressure at the desired level. This can be accomplished by means of an automatic throttle valve. The lower electrode 2 is radiantly heated by means of heater 7 to the desired temperature and the temperature monitored by the thermocouple 6 mounted in a cavity in the electrode 2. Typically, electrode temperatures are adjusted over the range of 30° to 450° C., but higher temperatures can be used if desired. RF power of a frequency such as 100 kilohertz or alternatively 13.56 MHz is applied by a variable frequency amplifier/signal generator system and monitored by conventional means. Typical RF power levels are 8 to 10 watts or 0.025-0.032 watts/square centimeter. The reactant gases are then allowed to flow through the reactant gas inlet ports 8 and 9 to maintain the desired pressure. In the deposition of alumunium oxide from the reaction of trimethylaluminum (TMA) and carbon dioxide, the trimethylaluminum is contained in a bubbler outside of the vacuum system which is held at a desired temperature, typically about −10° C. The particular temperature employed, as well as the flow rates and mixtures would vary depending upon the particular trialkylaluminum compound used as the reactant. Again, in the case of trimethylaluminum a flow of about 5 sccm of argon through the TMA appears to give optimum results. Carbon dioxide flow rates of 400 to 700 sccm mixed with argon at a flow rate of about 400 sccm appeared optimum for the particular vacuum system configuration employed. Nozzles for the gas inlets 8 and 9 are typically constructed of stainless steel. The upper inlet nozzle 9 used for the $CO_2$ inlet has a slit along its length while the lower inlet nozzle 8 used for TMA inlet is provided with a plurality of inlet holes in the nozzle. The reactant gases are admitted into the reaction vessel in a manner to cause them to flow between the electrodes 2 and 3 across the respective electrode surfaces. This flow is enhanced by the vacuum exhaust port 10 being opposite the gas inlet nozzles. Typical substrate wafer sizes coated with aluminum oxide by this method were 100 to 150 mm. Typical electrode sizes were in the neighborhood of about 49 in.$^2$.

Generally, all substrate wafers were chemically cleaned prior to deposition as is known in the art. Plasma cleaning at an RF power level of about 8 watts for two minutes at a pressure of 0.5 torr in either argon or oxygen was employed in order to observe any difference or effects of the cleaning procedure upon the deposited film. The resultant films were characterized by their electrical parameters such as capacitance-voltage measurements, current-voltage measurements, breakdown field measurements and the like. Further, film thickness measurements were made and deposition rates determined. Etch rate data was also obtained from the deposited film and the films were examined for pin holes. Additionally, stress measurements were made on the deposited films.

It has been determined that films prepared by the novel method are generally of high quality. That is, they are of a quality that is useful in semiconductors and in integrated circuits. Typically such films have resistivities of at least $10^{13}$ ohm-cm, breakdown strengths of at least $10^6$ volts per cm for a 1000 angstrom thick film, and dielectric constants of typically between 6 to 10 at 1 MHz. Further, such films should have an insignificant amount of or no mobile ions present therein.

Important in the operation of applicants' method for depositing aluminum oxide films is the ability to maintain a uniform concentration of reactants over the surface of the substrate and to prevent premature gas state reaction within the plasma which leads to the formation of powders and particles in the plasma which then deposit on the film in a manner which results in a low quality rather than a high quality film. This has been the problem previously with prior art attempts to form high quality aluminum oxide films in a plasma. We have determined that one of the basic problems associated with the prior art techniques which use oxidants other than carbon dioxide, is the high oxygen concentration. This high oxygen concentration causes a gas phase reaction in the plasma above the substrate surface and precipitation of the gas phase reaction products in the plasma which then settle on the substrate surface. In comparison, the novel method results in a reaction essentially only on the surface of the substrate. $CO_2$ at a flow rate and concentration such that the residence time of oxygen atoms produced from dissociation of the $CO_2$ in the plasma is insufficient to cause substantial particular formation due to gas phase reaction in the plasma is critical in obtaining the results of the novel method. We have further found that there is poor or almost no deposition when all of the reactant, i.e., the trialkylaluminum compound and the $CO_2$, are mixed together and fed into the reactor through a single nozzle. It should be understood that the particular flow rates employed are dependent upon the electrode geometry, the spacing between electrodes, the overall gas pressure (the total pressure) in the vacuum system and the reactivity of the particular trialkylaluminum compound used as well as the RF power, substrate temperature and co-reactant concentration and flow rate. It should be understood that while the examples given above and those hereafter recited are the results from films employing trimethylaluminum as the source of aluminum for the growth of the films, other trialkylaluminum compounds, such as triethylaluminum or tripropylaluminum can be employed. It should also be noted that the effects of substrate temperature on film quality as monitored by index of refraction values and etch rates in hydrogen fluoride showed that the higher the substrate temperature the higher the quality. However, it also shows that films grown at less than 400° C. still resulted in high quality films suitable for use in the semiconductor industry. While higher temperatures can be employed at these temperatures, deposition of the oxide films can be made directly on aluminum without adversely affecting or melting the aluminum. Generally, it has also been found that while the deposition rate at low carbon dioxide flow rates, e.g., 100 sccm, was the same as the deposition rate on a wafer at higher flow rates, e.g., 400 sccm, the quality of the film at the lower deposition rate was significantly lower under the geometries and conditions as previously described. Additionally, the uniformity of the film was poorer at the lower flow rate. While the flow rate of the carbon dioxide is important as discusses above, it was found that the flow rate of the TMA has little effect on either deposition rate or film quality. Thus the best conditions are those in which the trialkylaluminum is introduced near the wafer surface and flows across it, saturating the surface by physical and/or chemical adsorption. Oxygen atoms produced from the $CO_2$ containing plasma diffuse to the surface to produce the film on the wafer surface, the concentration of oxygen atoms being too low in the plasma to result in gas phase products in the plasma which then fall on the surface.

Figure 2:
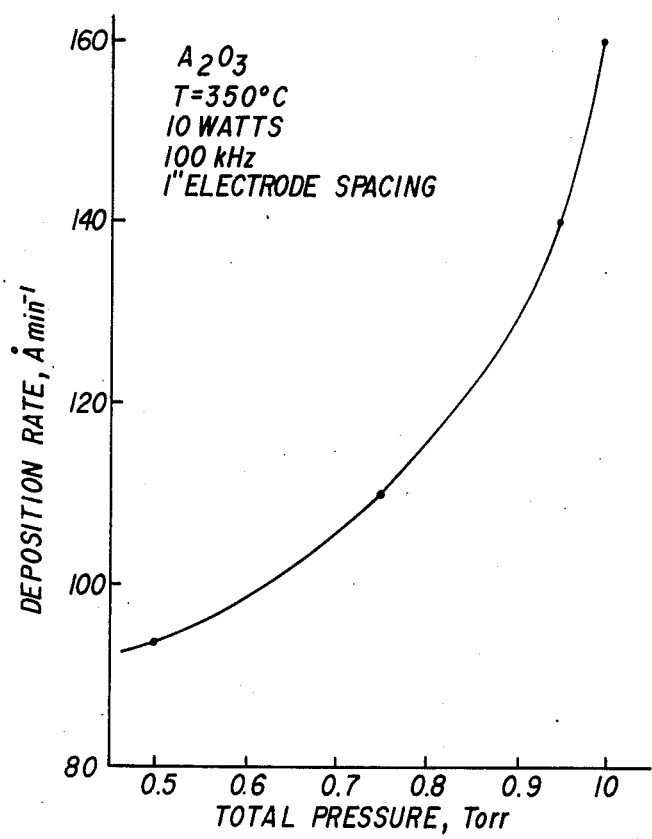
FIG. 2 is a graph showing the film deposition rate in A./min. as a function of the total pressure present in the apparatus.

Referring to FIG. 2, there is shown the deposition rate of high quality aluminum oxide films produced as described as a function of the total gas pressure. The lower pressures were limited by the system pumping speed and the higher pressures resulted in gas phase reactions and/or film thickness nonuniformity. Preferred pressure ranges are between 0.5 and 0.7 torr.

Stress of 0.5 and 1.0 micron thick aluminum oxide films on silicon wafers was measured. The typical stress found was $2\text{-}3\times10^{-9}$ dynes-cm$^{-2}$ tensil. This is similar to or lower than that reported for plasma enhanced CVD deposited silicon dioxide. It may be noted that the films, as-deposited, are amorphous in structure and remain so even after annealing at 600° C. However, at an annealing temperature of 1000° C., the films convert to a material, polycrystalline in nature. Further, the as-deposited films have been found to contain small amounts of carbon, typically from ½ to 2 atomic percent. The electrical properties of the aluminum oxide films made in accordance with the present invention are depicted with reference to FIGS. 3-6.

Figure 3:
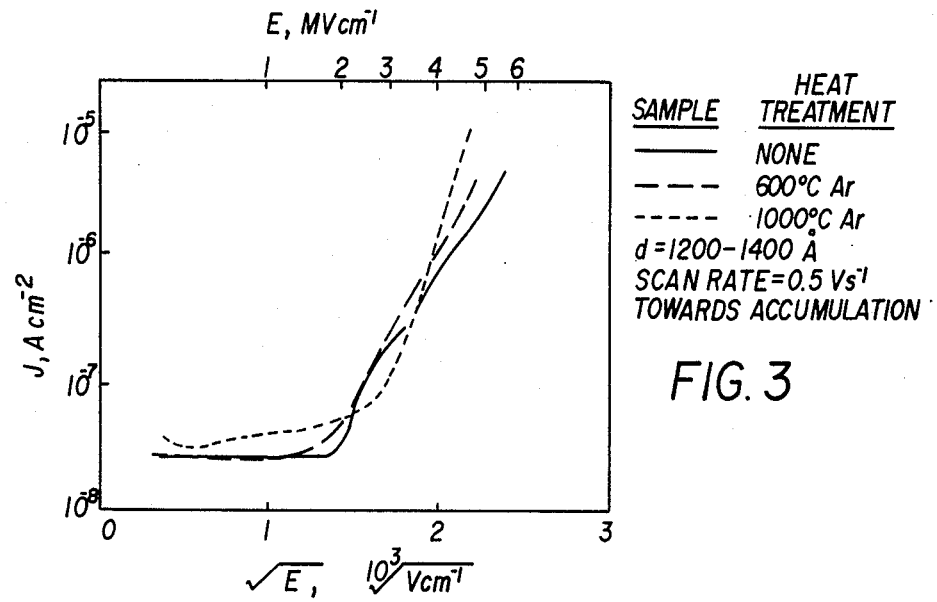
FIG. 3 is a graph showing the leakage current in $Amp/cm^2$ versus the electric field in megavolts per centimeter applied across an aluminum oxide film, as-deposited, annealed at 600° C. and annealed at 1000° C. in argon.

Leakage current across the oxide was measured as a function of the positive increasing gate voltage (toward accumulation in the silicon substrate) at a voltage ramp rate of 0.5 volts per second. The aluminum oxide film thickness of the samples was between 1200-1400 angstroms. The results of these measurements are shown in FIG. 3 for as-deposited, as well as argon annealed films, annealed at 600° C. and 1000° C. As can be seen with reference to FIG. 3, a voltage threshold of about 2 MV/cm is apparent. Below this value the leakage current density is constant between about $3\text{-}4\times10^{-8}$ amps/cm$^2$. and above this value the leakage current density increases approximately linearly as the square root of the electric field applied. It can also be seen that the as-deposited film utilizing a 350° C. substrate temperature shows a leakage which is almost identical to the 600° C. annealed film indicating that the as-deposited films are electrically temperature stable. The 1000° C. films are slightly leakier, probably due to the fact that these films become polycrystalline and leakage could occur through the grain boundaries. Resistivity of the films calculated from the leakage current values at a voltage of 1 MV/cm applied across the oxide are generally from about $2\text{-}4\times10^{13}$ ohms/cm.

The breakdown field of the aluminum oxide films was determined by applying a voltage across the oxide and observing, on a curve tracer, the voltage at which the current suddenly increased to the point of no return. The voltage was ramped manually holding the voltage stationary for one second every ten volts. The voltage scan direction was toward accumulation in the silicon substrate. It was found that breakdown of the films statistically is centered in about the 7.5 to 9 MV/cm range for as-deposited films grown at a substrate at about 350° C. as well as the same films after exposing to a 600° C. argon anneal and a 1000° C. argon anneal. These values are comparable to thermally grown silicon dioxide films.

Figure 4:
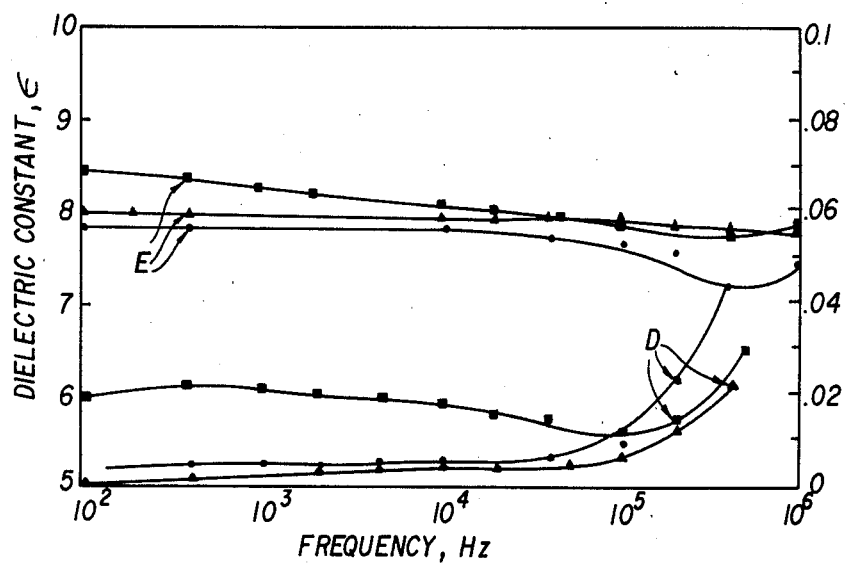
FIG. 4 is a graph showing the dielectric constant ($\epsilon$) and dissipation factor (D) as a function of frequency for as-deposited, 600° C. argon annealed and 1000° C. argon annealed aluminum oxide films.

The aluminum oxide dielectric constant ($\epsilon$) and dissipation factor (D) measured as a function of frequency between $10^2$ and $10^6$ Hz is shown in FIG. 4. To insure that the silicon substrate did not contribute to the measured capacitance and hence dielectric constant, a gate voltage of +30 volts was impressed across the oxide bringing the underlying n-doped silicon substrate into accumulation. In accumulation, the silicon capacitance is negligible compared to the oxide capacitance. Capacitance-voltage curves were also generated at the lowest and highest measuring frequencies to make sure the substrate surface was accumulated. The dielectric constant was calculated from the measured capacitance knowing the oxide thickness and the gate contact area. FIG. 4 shows the dielectric constant and dissipation factor as a function of frequency for as-deposited, as well as heat treated films. As can be seen from the figure, the dissipation factor for the as-deposited and 600° C. annealed films is essentially the same over most of the frequency range while the films annealed at 1000° C. show a somewhat higher dissipation factor and hence are lossier. The dielectric constant for the films is in the range of approximately 7-9 and generally around 8.

Figure 5:
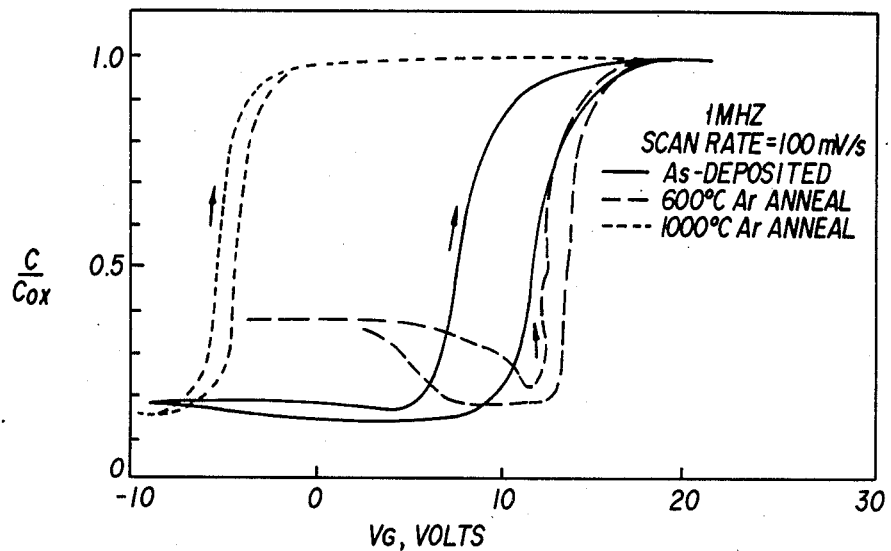
FIG. 5 shows capacitance-voltage curves taken at 1 MHz at a scan rate of 100 millivolts per second for as-deposited, 600° C. and 1000° C. argon annealed aluminum oxide films on a silicon substrate.
Figure 6:
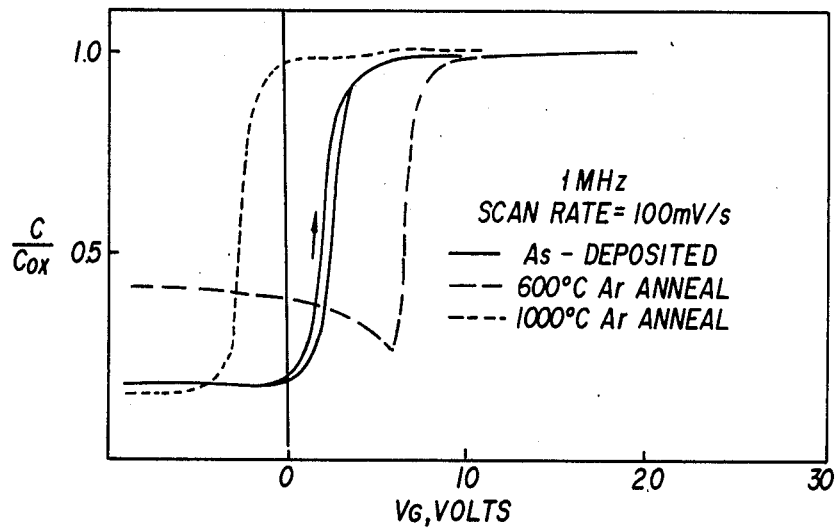
FIG. 6 is similar to that of FIG. 5, but shows the effect on the 1 MHz capacitance-voltage curves of oxygen plasma exposure of the silicon substrate prior to deposition of the aluminum oxide film thereon.

The capacitance-voltage measurements as shown in FIG. 5 give information about the electrical quality of the aluminum-oxide silicon interface. Charges in the oxides are of consequence in electrical devices because of the instability they induce in threshold voltage values, time delays, premature oxide breakdown and current leakage. The C-V curves shown are the results of scanning from accumulation to inversion and back to accumulation at a voltage scan rate of 100 MV/sec. It may be noted that the C-V curves depend upon the substrate cleaning process prior to film deposition. For example, there is a shift in the curves and a difference in the hysteresis obtained when the precleaning of the substrate includes the steps of plasma exposing the substrate in argon versus oxygen. Substrate pre-exposed to an oxygen plasma, for example, have fewer surface states which result in smaller hysteresis than substrates not exposed to a plasma.

It should also be indicated that films deposited in accordance with the present method showed no mobile ions present.

What is claimed is:
1. A method of depositing an amorphous thin film of aluminum oxide in a plasma comprising
 (a) introducing a vapor of a trialkylaluminum reactant in an inert carrier gas into an evacuated vessel having spaced parallel electrodes, one electrode supporting, or itself being, a substrate for film deposition, the vapor being introduced in a region at or near the surface of said substrate in a manner such that it flows uniformly thereacross;
 (b) introducing $CO_2$ together with an inert carrier gas into the vessel in a region of the plasma above the region where said trialkylaluminum is introduced, said $CO_2$ being introduced at a concentration and rate such that the residence time of oxygen atoms produced by dissociation of the $CO_2$ in the plasma is insufficient to cause substantial particle formation due to gas phase reaction in the plasma;

(c) heating the substrate to a temperature suitable for aluminum oxide deposition; and (d) applying an RF field across the spaced electrodes to create a plasma therebetween.

2. The method recited in claim 1 wherein the $CO_2$ is introduced at or near the surface of the electrode opposite the substrate bearing electrode.

3. The method recited in claim 2 wherein the electrodes are essentially parallel to one another and a vacuum exhaust port is provided in the same plane as the plasma between the electrodes and opposite the gas inlet to assist in promoting gas flow across the electrodes.

4. The method reited in claim 1 wherein the substrate is heated to a temperature of from 30°–450° C.

5. The method recited in claim 1 wherein the trialkylaluminum is trimethylaluminum.

6. The method recited in claim 5 wherein the trimethylaluminum vapor is introduced by passing argon gas through a bubbler containing liquid trimethylaluminum.

7. The method recited in claim 6 wherein said liquid trimethylaluminum is kept at a temperature of about −10° C. and the argon flow rate is about 5 sccm.

8. The method recited in claim 7 wherein the flow rate of $CO_2$ is between about 400–700 sccm.

9. The method recited in claim 1 wherein the flow rate of $CO_2$ is between about 400–700 sccm.

10. A method for depositing a high quality amorphous aluminum oxide film on a silicon substrate in a plasma comprising:

(a) bubbling argon gas tnrough liquid trimethylaluminum to obtain a mixture of argon and trimethylaluminum vapor;

(b) introducing the mixture into an evacuated vessel having top and bottom parallel spaced electrodes therein, said bottom electrode supporting said silicon substrate, said mixture being introduced in a manner so as to pass uniformly over the surface of the substrate;

(c) introducing a mixture of $CO_2$ and argon into said vessel above the trimethylaluminum vapor inlet and at or near the surface of the top electrode, the flow rate of $CO_2$ being from 400–700 sccm;

(d) heating the substrate to a temperature of up to 450° C.;

(e) maintaining a total pressure in said vessel of from 0.5–0.7 torr;

(f) applying an RF field across said electrodes to create a plasma therebetween; and (g) depositing an amorphous aluminium oxide film over the substrate.

11. The method recited in claim 10 wherein the RF power is from 0.025–0.032 watts/cm² based upon electrode area.

* * * * *